(12) United States Patent
Hsieh et al.

(10) Patent No.: US 9,354,720 B1
(45) Date of Patent: May 31, 2016

(54) LOW-PROFILE CAPACITIVE POINTING STICK

(71) Applicant: Synaptics Incorporated, San Jose, CA (US)

(72) Inventors: Lin-Hsiang Hsieh, Taoyuan (TW); Tzeng-Fu Kao, Taipei (TW); Chao-Wei Lee, Taipei (TW)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 14/581,745

(22) Filed: Dec. 23, 2014

(51) Int. Cl.
*G06F 3/03* (2006.01)
*G06F 3/0338* (2013.01)
*G06F 3/038* (2013.01)
*G06F 3/041* (2006.01)
*H03K 17/94* (2006.01)

(52) U.S. Cl.
CPC ............ *G06F 3/0338* (2013.01); *G06F 3/0383* (2013.01); *G06F 3/041* (2013.01); *H03K 17/94* (2013.01)

(58) Field of Classification Search
CPC ........ G06F 3/041; G06F 3/0338; H03K 17/94
USPC .......................................... 345/157
See application file for complete search history.

(56) References Cited

U.S. PATENT DOCUMENTS

| 4,422,035 | A | | 12/1983 | Risko |
| 4,719,538 | A | * | 1/1988 | Cox ..................... G01D 5/2417 361/283.2 |
| 5,012,231 | A | | 4/1991 | Felsenstein |
| 5,521,596 | A | | 5/1996 | Selker et al. |
| 5,541,622 | A | | 7/1996 | Engle et al. |
| 5,576,704 | A | | 11/1996 | Baker et al. |
| 5,696,535 | A | | 12/1997 | Rutledge et al. |
| 5,786,997 | A | | 7/1998 | Hoyt et al. |
| 5,861,583 | A | | 1/1999 | Schediwy et al. |
| 5,889,507 | A | | 3/1999 | Engle et al. |
| 5,914,465 | A | | 6/1999 | Allen et al. |
| 5,949,354 | A | | 9/1999 | Chang |
| 5,956,018 | A | | 9/1999 | Pejic et al. |
| 5,973,668 | A | | 10/1999 | Watanabe |
| 6,184,865 | B1 | | 2/2001 | Zimmerman et al. |
| 6,400,355 | B1 | | 6/2002 | Pin-Chien |
| 6,437,772 | B1 | | 8/2002 | Zimmerman et al. |
| 6,480,183 | B1 | | 11/2002 | Van Ruymbeke et al. |
| 6,642,857 | B1 | * | 11/2003 | Schediwy ............. G06F 3/0338 341/20 |
| 6,646,631 | B2 | * | 11/2003 | Suzuki .................. G06F 3/0338 345/157 |
| 6,753,848 | B2 | * | 6/2004 | Toshiharu ........... G06F 3/03548 345/157 |
| 7,978,175 | B2 | * | 7/2011 | Orsley .................... G06F 3/016 345/157 |
| 8,125,445 | B1 | | 2/2012 | Anderson |
| 8,760,408 | B2 | * | 6/2014 | Heesemans ........... G06F 3/0414 178/19.04 |
| 9,134,817 | B2 | * | 9/2015 | Olsson .................. G06F 3/0338 |
| 2003/0151589 | A1 | * | 8/2003 | Bensen ................. G06F 3/0414 345/156 |
| 2013/0099802 | A1 | * | 4/2013 | Hsieh ..................... G06F 3/044 324/661 |

* cited by examiner

*Primary Examiner* — Nathan Ha
(74) *Attorney, Agent, or Firm* — Patterson + Sheridan, LLP

(57) ABSTRACT

In an example, an isometric input device configured to control a user interface indicator of an electronic device includes a plurality of sensor electrodes, a control member, a conductive support substrate, and a compliant member. The plurality of sensor electrodes is disposed on a sensor substrate. The control member is mechanically coupled to the sensor substrate over at least a portion of the plurality of sensor electrodes. The compliant member is disposed between the sensor substrate and the conductive support substrate. The compliant member defines a gap between the sensor substrate and the conductive support substrate.

20 Claims, 6 Drawing Sheets

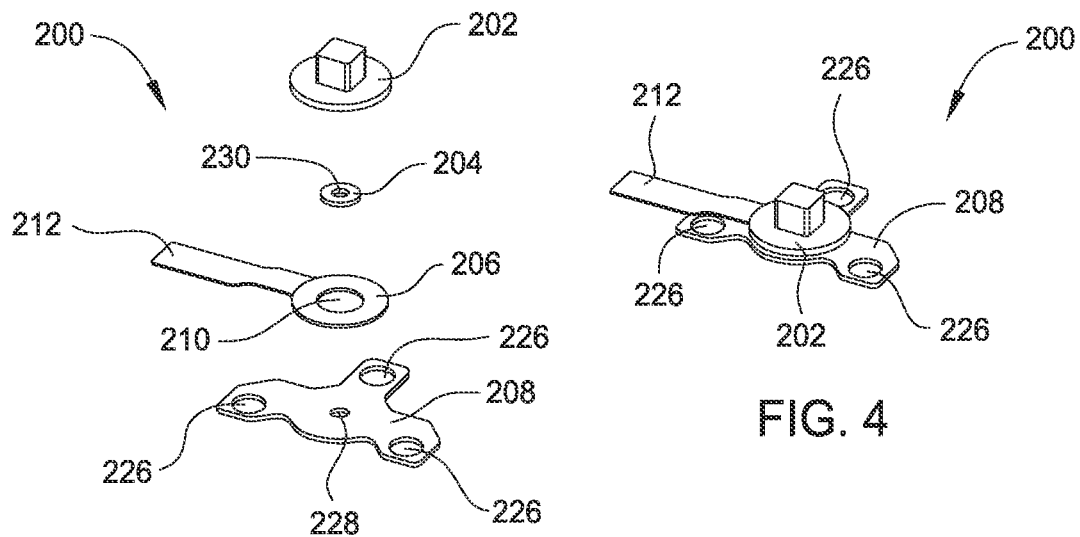
FIG. 2
FIG. 4
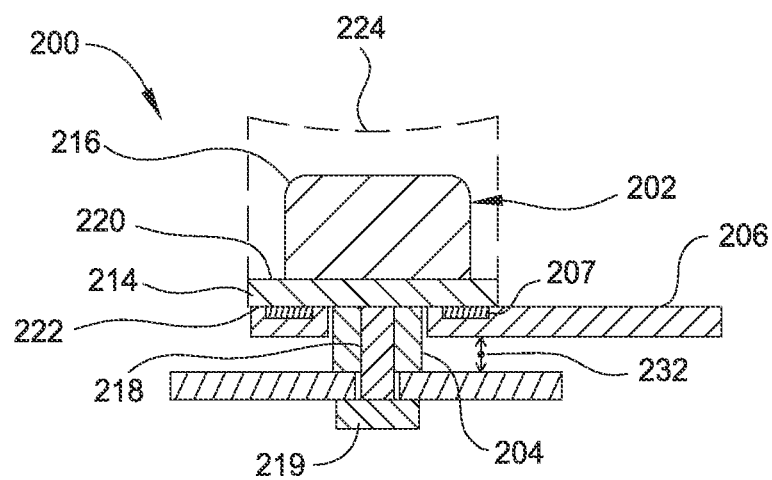
FIG. 3

LOW-PROFILE CAPACITIVE POINTING STICK

BACKGROUND

1. Field of the Disclosure

Embodiments generally relate to input sensing and, in particular, to input sensing using a low-profile capacitive pointing stick.

2. Description of the Related Art

Electronic devices, such as computers, can include or be connected to various input devices for interacting with a user. Example input devices include keyboards, pointing devices, proximity sensor devices (also commonly called touchpads or touch sensor devices), and the like. Both a pointing device and a touchpad can be used to provide input interfaces to the electronic device. For example, a pointing device and/or touchpad allow the user to move a cursor or other type of user interface indicator on a display. A "pointing stick" is one type of pointing device used, for example, with desktop and notebook computers. A pointing stick is a small analog joystick, usually disposed between the keys of a keyboard, which the user can manipulate to provide input to the electronic device. In some electronic devices (e.g., notebook computers), a pointing stick can be provided as an input option alongside a touchpad.

SUMMARY

Embodiments generally provide an input device, a processing system, and method to control a user interface indicator of an electronic device. In an embodiment, an isometric input device configured to control a user interface indicator of an electronic device includes a plurality of sensor electrodes, a control member, a conductive support substrate, and a compliant member. The plurality of sensor electrodes is disposed on a sensor substrate. The control member is mechanically coupled to the sensor substrate over at least a portion of the plurality of sensor electrodes. The compliant member is disposed between the sensor substrate and the conductive support substrate. The compliant member defines a gap between the sensor substrate and the conductive support substrate.

In an embodiment, a processing system for an input device configured to control a user interface indicator of an electronic device includes a sensor module and a determination module. The sensor module includes sensor circuitry and is configured to operate a plurality of sensor electrodes on a sensor substrate mechanically coupled to a control member by driving a sensing signal on a first subset of the plurality of electrodes and receiving resulting signals from a second subset of the plurality of electrodes. The resulting signals include effects from a change in spacing between the sensor substrate and a conductive support substrate caused by a deflection of the control member. The determination module is configured to measure a change in capacitive coupling between the plurality of sensor electrodes and the conductive support substrate based on the resulting signals.

In an embodiment, a method of operating an input device configured to control a user interface indicator of an electronic device includes: operating a plurality of sensor electrodes on a sensor substrate mechanically coupled to a control member by driving a sensing signal on a first subset of the plurality of electrodes and receiving resulting signals from a second subset of the plurality of electrodes, the resulting signals including effects from a change in spacing between the sensor substrate and a conductive support substrate caused by a deflection of the control member; and measuring a change in capacitive coupling between the plurality of sensor electrodes and the conductive support substrate based on the resulting signals.

BRIEF DESCRIPTION OF THE DRAWINGS

So that the manner in which the above recited features of embodiments can be understood in detail, a more particular description of embodiments, briefly summarized above, may be had by reference to embodiments, some of which are illustrated in the appended drawings. It is to be noted, however, that the appended drawings illustrate only typical embodiments and are therefore not to be considered limiting of scope, for other equally effective embodiments may be admitted.

FIG. 2 is an exploded view of an input device in accordance with embodiments.

FIG. 3 is a cross-sectional side view of the input device of FIG. 2 in accordance with embodiments.

FIG. 4 is an isometric view of the input device of FIG. 2 in accordance with embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

The following detailed description is merely exemplary in nature and is not intended to limit the embodiments or the application and uses of such embodiments. Furthermore, there is no intention to be bound by any expressed or implied theory presented in the preceding technical field, background, brief summary or the following detailed description.

Various embodiments provide for input sensing using a low-profile capacitive pointing stick. An input device implementing a capacitive pointing stick. These and further aspects are described further below.

Figure 1:
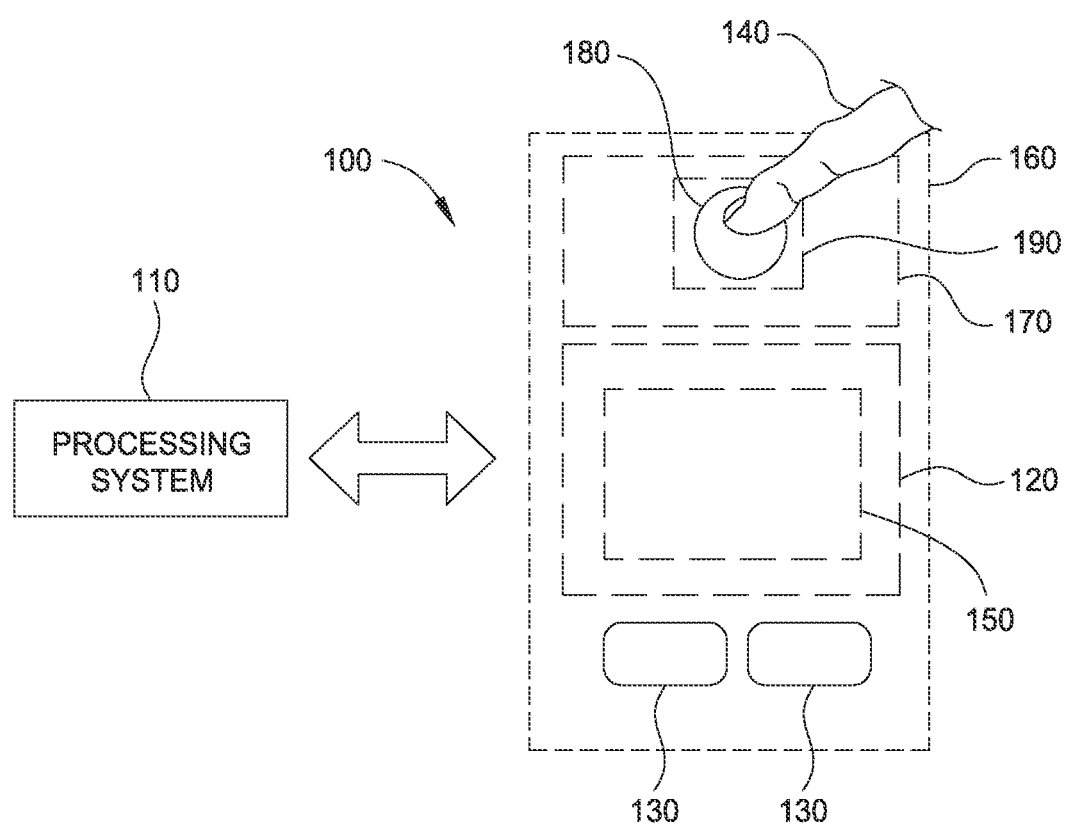
FIG. 1 is a block diagram of a system that includes an input device according to an example implementation.

Turning now to the figures, FIG. 1 is a block diagram of an exemplary input device 100 in accordance with embodiments. In various embodiments, the input device 100 comprises one or more sensing devices, each of which can be integrated in, or coupled to, an electronic device 160. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice) and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system or can be physically separate from the electronic system. As appropriate, the input device 100 may communicate with parts of the electronic system using any one or more of the following: buses, networks, and other wired or wireless interconnections (including serial and or parallel connections). Examples include I²C, SPI, PS/2, Universal Serial Bus (USB), Bluetooth, RF, and IRDA.

In the embodiment depicted in FIG. 1, the input device 100 includes one or more input devices, such as a pointing stick 180 and a proximity sensor device 150 (also often referred to as a "touchpad" or a "touch sensor device"), each of which is configured to sense input provided by input object(s) 140 (illustratively shown as a user's finger). Proximity sensor device 150 is configured to sense input object(s) 140 in a sensing region 120. The pointing stick 180 is configured to sense input object(s) 140 in a sensing region 190. In an embodiment, the pointing stick 180 is disposed within or alongside another device 170, such as a keyboard (e.g., the pointing stick 180 can be disposed between keys of a keyboard). Alternatively, the pointing stick 180 can be a "stand-alone" device separate and apart from any other input device. In some embodiments, the proximity sensor device 150 can be integrated into a display device (not shown) (e.g., a touch screen). In other embodiments, the proximity sensor device 150 can be a stand-alone device (e.g., a touchpad). In some embodiments, the proximity sensor device 150 is omitted.

Sensing regions 120, 190 encompass any space above, around, in, and/or near the input device 100 in which the input device 100 is able to detect user input (e.g., user input provided by input object(s) 140). The sizes, shapes, and locations of particular sensing regions may vary widely from embodiment to embodiment. In some embodiments, the sensing regions 120, 190 extend from a surface of the input device 100 in one or more directions into space until signal-to-noise ratios prevent sufficiently accurate object detection. The distance to which the sensing regions 120, 190 extend in a particular direction, in various embodiments, may be on the order of less than a millimeter, millimeters, centimeters, or more, and may vary significantly with the type of sensing technology used and the accuracy desired. Thus, in some embodiments, the proximity sensor device 150 and the pointing stick 180 sense input that comprises no contact with any surfaces of the input device 100, contact with an input surface (e.g., a touch surface) of the input device 100, contact with an input surface of the input device 100 coupled with some amount of applied force or pressure, and/or a combination thereof.

The input device 100 may utilize any combination of sensor components and sensing technologies to detect user input in the sensing regions 120, 190. The input device 100 comprises one or more sensing elements for detecting user input. Cursors, menus, lists, items, and other user interface indicators may be displayed as part of a graphical user interface and may be scaled, positioned, selected scrolled, or moved in response to sensed user input.

In some capacitive implementations of the input device 100, voltage or current is applied to create an electric field. Nearby input objects cause changes in the electric field and produce detectable changes in capacitive coupling that may be detected as changes in voltage, current, or the like.

Some capacitive implementations utilize arrays or other regular or irregular patterns of capacitive sensing elements, such as sensor electrodes, to create electric fields. In some capacitive implementations, separate sensing elements may be ohmically shorted together to form larger sensor electrodes. Some capacitive implementations utilize resistive sheets (e.g., may comprise a resistive material such as ITO or the like), which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, changing the measured capacitive coupling. In one implementation, an absolute capacitance sensing method operates by modulating sensor electrodes with respect to a reference voltage (e.g., system ground) and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals and/or to one or more sources of environmental interference (e.g., other electromagnetic signals). Sensor electrodes may be dedicated transmitters or receivers, or sensor electrodes may be configured to both transmit and receive. Alternatively, the receiver electrodes may be modulated relative to ground.

In FIG. 1, a processing system 110 is shown as part of the input device 100. The processing system 110 is configured to operate the hardware of the input device 100 to detect input in the sensing regions 120, 190. The proximity sensor device 150 and the pointing stick 180 generally include an array of sensing elements. The processing system 110 comprises parts of, or all of, one or more integrated circuits (ICs) and/or other circuitry components. For example, a processing system for a mutual capacitance sensor device may comprise transmitter circuitry configured to transmit signals with transmitter sensor electrodes and/or receiver circuitry configured to receive signals with receiver sensor electrodes. In some embodiments, the processing system 110 also comprises electronically-readable instructions, such as firmware code, software code, and/or the like. In some embodiments, components of the processing system 110 are located together, such as near sensing element(s) of the input device 100. In other embodiments, components of processing system 110 are physically separate with one or more components close to sensing element(s) of input device 100 and one or more components elsewhere. For example, the input device 100 may be a peripheral coupled to a desktop computer, and the processing system 110 may include software configured to run on a central processing unit of the desktop computer and one or more ICs (perhaps with associated firmware) separate from the central processing unit. As another example, the input device 100 may be physically integrated in an electronic device, and the processing system 110 may comprise circuits and firmware that are part of a main processor of the electronic device (e.g., a notebook computer). In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing regions 120, 190 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates sensing element(s) of the input device 100 to produce electrical signals indicative of input (or lack of input) in the sensing regions 120, 190. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120 or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

It should be understood that while many embodiments are described in the context of a fully functioning apparatus, the mechanisms of the embodiments are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

FIG. 2 is an exploded view of an input device 200 in accordance with embodiments. FIG. 3 is a cross-sectional side view of the input device 200 in accordance with embodiments. FIG. 4 is an isometric view of the input device 200 in accordance with embodiments. Referring to FIGS. 2-4, the input device 200 can be used as an embodiment of the pointing stick 180 shown in FIG. 1 to control a user interface indicator of an electronic device. The input device 200 includes a control member 202, a compliant member 204, a substrate 206 (also referred to as a sensor substrate), and a conductive support substrate 208. The substrate 206 includes sensor electrodes 207 disposed thereon. The substrate 206 can include one or more conductive layers (not shown) separated by one or more dielectric layers (not shown). For example, the substrate 206 can be a printed circuit board (PCB), flexible printed circuit (FPC), or the like. In the present example, the substrate 206 has an annular shape having an aperture 210 in the center thereof. In other examples, the substrate 206 can have a different shape generally having an aperture. The sensor electrodes 207 on the substrate 206 can be coupled to conductive traces (not shown) a connection medium 212, such as an FPC, ribbon cable, or the like, which can be used to drive signals to, and receive signals from, the sensor electrodes 207. The connection medium 212 communicatively couples the input device 200 to the processing system 110. In an embodiment, the processing system 110 is also coupled to a capacitive touch pad of the electronic device.

In an embodiment, the sensor electrodes 207 can be formed using multiple layers of the substrate 206. In other examples, the sensor electrodes 207 can be formed on a single layer of the substrate 206. In an embodiment, at least two layers of the sensor electrodes 207 can be provided. The sensor electrodes 207 in a first layer can be used to detect motion of the pointing stick 180 as described herein. The sensor electrodes 207 in a second layer can be used to detect input proximate the pointing stick 180 using capacitive touch sensing techniques (e.g., absolute sensing or transcapacitive sensing, as described above). For example, the sensor electrodes 207 on the second layer can be used to detect the presence of an input object, gestures performed by an input object, or the like associated with capacitive touch sensing. The second layer can be disposed on top of the first layer (e.g., more proximate the control member 202). Alternatively, the second set of sensor electrodes 207 can be formed on an additional substrate, which can be adhered to the substrate 206 or adhered to the control member 202. Thus, the sensor electrodes 207 can be configured to detect motion of the pointing stick 180, or both motion of the pointing stick 180 and input proximate the pointing stick 180 (e.g., a finger touching the pointing stick 180 or proximate the pointing stick 180).

The control member 202 is mechanically coupled to the sensor substrate 206. As shown, the control member 202 includes a base 214, an adapter 216 extending upwards from a top surface 220 of the base 214, and a post 218 extending downward from a bottom surface 222 of the base 214. The control member 202 can comprise, for example, a single plastic element that is molded, printed, or the like using known techniques to form the base 214, the adapter 216, and the post 218. The base 214 and the post 218 are cylindrical in shape, while the adapter 216 has a box shape. The sensor substrate 206 can be adhered to the bottom surface 222 of the base 214 using an adhesive. The post 218 passes through the aperture 210 of the substrate 206. The bottom surface 222 of the base 214 extends over the sensor electrodes 207. In general, the bottom surface 222 of the base 214 extends over at least a portion of the sensor electrodes 207. The input device 200 can include an optional cap 224 mounted to the adapter 216 (shown in FIG. 3). The cap 224 can provide an input surface for a user's finger. The cap 224 can be fixedly mounted to the adapter 216 using, for example, an adhesive. Alternatively, the cap 224 can be removably mounted to the adapter 216 (e.g., held in place through friction). The cap 224 can comprise a semi-rigid material, such as plastic, or a compliant material, such as an elastomer.

The control member 202 shown in FIGS. 2-4 is just one example control member that can be used in the input device 200. The shapes of the base 214, the adapter 216, and the post 218 can differ from that shown. In some examples, the cap 224 can be omitted and the adapter 216 can be shaped as a nub or other protuberance that provides an input surface for a user's finger.

The conductive support substrate 208 is mounted to a substrate (not shown) of the electronic device in which the input device 200 is mounted, such as a keyboard plate. Through mounting, the conductive substrate 208 is ohmically coupled to a substantially constant electrical potential, such as an electrical ground. The sensor electrodes 207 are capacitively coupled to the conductive support substrate 208. The conductive support substrate 208 can include one or more mounting holes 226 (e.g., three are shown). The conductive support substrate 208 can be mounted to the electronic device using fasteners (not shown) passing through the mounting holes 226. The conductive support substrate 208 also includes an aperture 228 through which the post 218 extends. The post 218 is mechanically coupled to the conductive support substrate 208. For example, the post 218 can be heat staked to the conductive support substrate 208. That is, an end of the post 218 can be melted such that the post 218 adheres to the conductive support substrate 208 and provides a pivot 219 about which the control member 202 can tilt. The conductive support substrate 208 can comprise metal or other conductive material. The conductive support substrate 208 can have any of a myriad of shapes, depending on how the input device 200 is to be mounted to the electronic device. The conductive support substrate 208 is not limited to any particular shape, including the shape shown in FIGS. 2-4.

The compliant member 204 is disposed between the base 214 of the control member 202 and the conductive support substrate 208. The compliant member 204 can comprise a compliant material, such as an elastomeric material (e.g., silicone rubber). The compliant member 204 has a cylindrical shape and includes an aperture 230 through which the post 218 extends. For example, the compliant member 204 can comprise an elastomeric washer or the like. In other examples, the compliant member 204 can have a different shape generally having an aperture that allows the post 218 to pass through the compliant member 204. The compliant member 204 contacts the bottom surface 222 of the base 214 at one end, and the conductive support substrate 208 at the other end. The compliant member 204 passes through the aperture 210 of the substrate 206. The compliant member 204 defines a gap 232 between the substrate 206 and the conductive support substrate 208.

Figure 5:
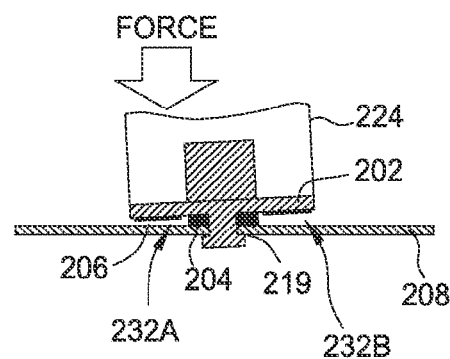
FIG. 5 is a simplified cross-sectional side view of the input device of FIG. 2 where a force is applied thereto.

FIG. 5 is a simplified cross-sectional side view of the input device 200 where a force is applied to the control member 202. Some reference characters shown in FIGS. 2-4 are omitted for clarity. In the present example, a force is applied to the cap 224, which is transferred to the control member 202. In cases where the cap 224 is omitted, the force is applied directly to the control member 202. The force is applied proximate an edge of the control member 202 such that the control member rotates about the pivot 219. Due to the rotation, one portion of the substrate 206 is disposed nearer to the conductive support substrate 208, and another portion of the substrate 206 is disposed farther from the conductive support substrate 208. Thus, a gap 232A beneath the edge of the control member 202 having the applied force is narrower than a gap 232B beneath the opposite edge of the control member 202. As the force is applied, some of the electrodes 207 on the substrate 206 are brought nearer to the conductive support substrate 208, while others of the electrodes 207 are brought farther from the conductive support substrate 208. The compliant member 204 provides a biasing force opposite the force applied to the control member 202. When the force applied to the control member 202 is removed, the compliant member 204 provides a restoring force that causes the control member 202 to return to its initial state as shown in FIG. 3. In general, by applying force to the control member 202, some of the sensor electrodes 207 are brought closer to the conductive support substrate 208, while others of the sensor electrodes 207 are brought farther from the conductive substrate 208. The sensor electrodes 207 return to their initial position when the force is removed from the control member 202.

Figure 6:
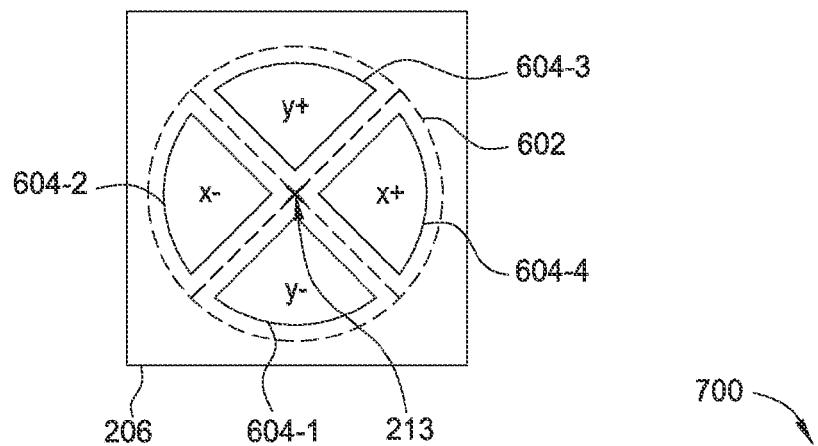
FIG. 6 is a schematic view of sensor electrodes on a substrate according to an embodiment.

FIG. 6 is a schematic view of the sensor electrodes 207 on the substrate 206 according to an embodiment. The substrate 202 includes a sensor electrode area 602 forming a sensing region for the input device 200. The sensor electrode area 602 can be divided into quadrants designated y−, x−, y+, and x+. The sensor electrodes 207 are disposed on the substrate 202 such that unique sensor electrode patterns 604-1, 604-2, 604-3, and 604-4 are disposed in the quadrants y−, x−, y+, and x+. A center 613 of the sensor electrode area 602 is substantially aligned with a center of the aperture 210 in the substrate 206 and the center of the control member 202.

In operation, the conductive support substrate 208 is held at a substantially constant voltage, such as electrical ground. In an example, the processing system 110 drives one or more of the sensor electrodes 207 with a transmitter signal and receives resulting signals from others of the sensor electrodes 207. The processing system 110 can determine measurements of transcapacitance from the resulting signals. The processing system 110 can establish baseline measurements of transcapacitance absent force applied to the control member 202. When a force is applied to the control member 202, at least one of the electrode patterns 604 is disposed nearer the conductive support substrate 208, and at least one of the electrode patterns 604 is disposed farther from the conductive support substrate 208. The transcapacitance measurements derived from those electrode patterns 604 that are disposed nearer and farther from the conductive support substrate 208 change from the baseline. In other examples, the processing system 110 can measure absolute capacitance derived from the electrode patterns 604. The absolute capacitance measurements change from a baseline as electrode pattern(s) 604 are brought nearer and farther from the conductive support substrate 208. In general, a force applied to the control member 202 results in a change in the gap 232 between the substrate 206 and the conductive support substrate 208, which changes a variable capacitance between at least one of the sensor electrodes 207 and the conductive support substrate 208.

For example, a force can be applied to the control member 202 such that the sensor electrode pattern 604-2 is brought nearer the conductive support substrate 208. Consequently, the sensor electrode pattern 604-4 is brought farther from the conductive support substrate 208. The processing system 110 detects changes in transcapacitance measurements associated with the sensor electrode patterns 604-2 and 604-4. In this manner, the processing system 110 can determine that the applied force is aligned with the x– quadrant. In another example, a force can be applied to the control member 202 such that the sensor electrode patterns 604-1 and 604-2 are brought nearer the conductive support substrate 208, and the sensor electrode patterns 604-3 and 604-4 are brought farther from the conductive support substrate 208. The processing system 110 detects changes in transcapacitance measurements from each of the sensor electrode patterns 604. In this manner, the processing system 110 can determine that the applied force is aligned between the x– and y– quadrants. By detecting force alignment, the processing system 110 can determine motion of a user interface indicator, such as a cursor.

Figure 7:
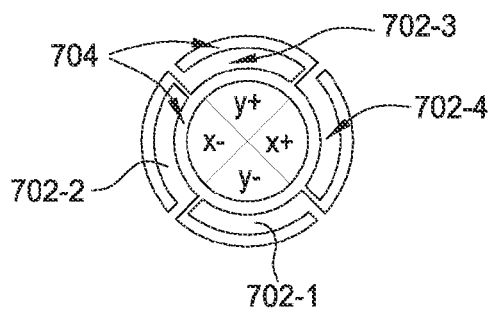
FIG. 7 is a top view showing a layout sensor electrodes on a substrate according to an embodiment.

FIG. 7 is a top view showing a layout 700 of the sensor electrodes 207 on the substrate 206 according to an embodiment. In the layout 700, the sensor electrodes 207 include receiver electrodes 702-1, 702-2, 702-3, and 704-4 (collectively receiver electrodes 702), and a transmitter electrode 704. Each of the receiver electrodes 702 comprises an arc-shaped electrode. The receiver electrodes 702 are arrange end-to-end to surround the aperture 210 of the substrate 206. The receiver electrodes 702 are ohmically isolated from one another. The transmitter electrode 704 has an annular shape with openings coinciding with the receiver electrodes 702. The openings are configured such that the transmitter electrode 704 is ohmically isolated from the receiver electrodes 702. In some examples, the receiver electrodes 702 and the transmitter electrode 704 can be formed on a single layer. Alternatively, the receiver electrodes 702 and the transmitter electrode 704 are formed on different layers. The receiver electrode 702-1 and the transmitter electrode 704 comprise the sensor electrode pattern 604-1 in the quadrant y–; the receiver electrode 702-2 and the transmitter electrode 704 comprise the sensor electrode pattern 604-2 in the quadrant x–; the receiver electrode 702-3 and the transmitter electrode 704 comprise the sensor electrode pattern 604-3 in the quadrant y+; and the receiver electrode 702-4 and the transmitter electrode 704 comprise the sensor electrode pattern 604-4 in the quadrant x+. The processing system 110 can drive the transmitter electrode 704 with a transmitter signal while receiving resulting signals from the receiver electrodes 702.

Figure 8:
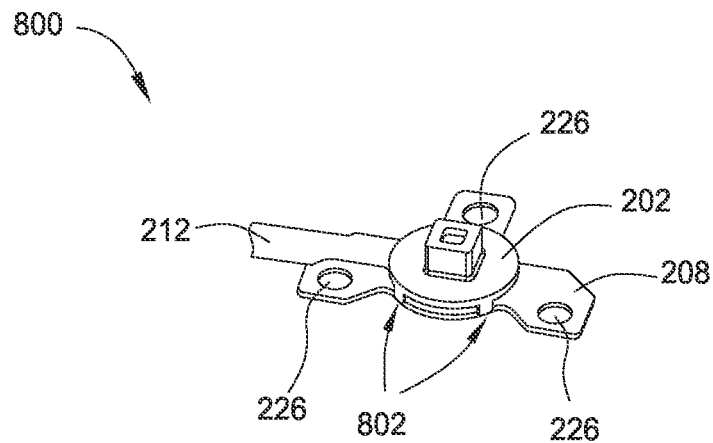
FIG. 8 is an isometric view of an input device according to another embodiment.
Figure 9:
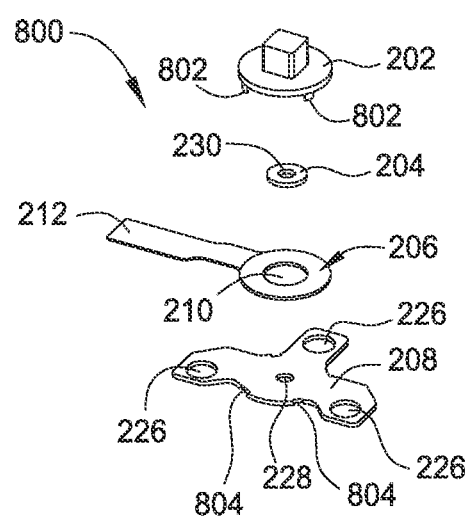
FIG. 9 is an exploded view of the input device of FIG. 8.

FIG. 8 is an isometric view of an input device 800 according to another embodiment. FIG. 9 is an exploded view of the input device 800 of FIG. 8. Elements of FIGS. 8 and 9 that are the same or similar to those of FIGS. 2-4 are designated with identical reference numerals. In the present example, the control member 202 includes a plurality of alignment features 802 extending from the bottom surface thereof. The alignment features 802 engage a plurality of alignment receiving features 804 in the conductive support substrate 208. The alignment receiving features 804 restrict planar translation and rotation of the control member 202 with respect to the conductive support substrate.

Figure 10:
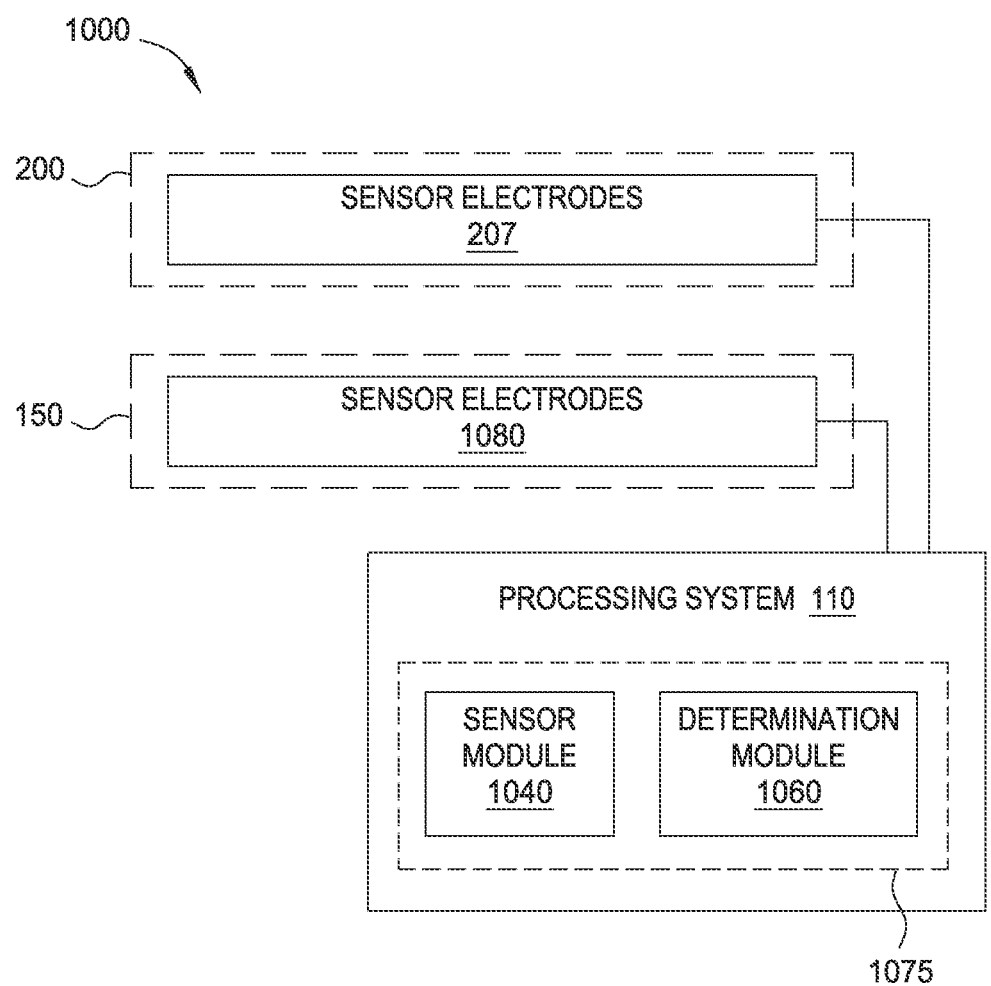
FIG. 10 is a block diagram of an input device according to an example implementation.

FIG. 10 is a block diagram of an input device 1000 according to an example implementation. The input device 1000 comprises an example implementation of the input device 100 shown in FIG. 1. The input device 1000 includes the pointing stick 180 coupled to the processing system 110. The pointing stick 180 can include the input device 200 or the input device 800 described above. Accordingly, the pointing stick 180 includes the sensor electrodes 207. In some embodiments, the processing system 110 is further coupled to a two-dimensional capacitive input device, such as the proximity sensor device 150. The proximity sensor device 150 can include a two-dimensional array of sensor electrodes 1080 that can be used for capacitive sensing of input. Thus, the processing system 110 can drive sensor electrodes of the pointing stick 180 or, in some embodiments, sensor electrodes of both the pointing stick 180 and the proximity sensor device 150.

In general, the processing system 110 drives sensor electrodes, receives from sensor electrodes, or both to measure changes in variable capacitance (e.g., transcapacitance or absolute capacitance). The terms "excite" and "drive" as used herein encompasses controlling some electrical aspect of the driven element. For example, it is possible to drive current through a wire, drive charge into a conductor, drive a substantially constant or varying voltage waveform onto an electrode, etc. The processing system 110 can drive a sensor electrode with a transmitter signal. A transmitter signal can be constant, substantially constant, or varying over time, and generally includes a shape, frequency, amplitude, and phase. The processing system 110 can receive a resulting signal from a sensor electrode. The resulting signal can include effects of an input object. The processing system 110 can determine measurements of transcapacitance or absolute capacitance from a resulting signal.

The processing system 110 can include a sensor module 1040 and a position determiner module 1060. The sensor module 1040 and the position determiner module 1060 comprise modules that perform different functions of the processing system 110. In other examples, different configurations of modules can perform the functions described herein. The sensor module 1040 and the position determiner module 1060 can be implemented using sensor circuitry 1075 and can also include firmware, software, or a combination thereof operating in cooperation with the sensor circuitry 1075.

The sensor module 1040 is configured to operate the sensor electrodes 207. As described above, the sensor electrodes 207 are disposed on a substrate 206 that is mechanically coupled to the control member 202. The sensor module 1040 is configured to drive a sensing signal on a first subset of the sensor electrodes 207 and receive resulting signals from a second subset of the sensor electrodes 207. For example, as shown in FIG. 7, the sensor module 1040 can drive the transmitter electrode 704 with a sensing signal and receive resulting signals from the receiver electrodes 702. The resulting signals include effects from a change in spacing between the substrate 206 and the conductive support substrate 208 caused by a deflection of the control member 202. While the sensor module 1040 is operating the sensor electrodes 207, the sensor module 1040 can also operate the sensor electrodes 1080.

The determination module 1060 is configured to measure a change in capacitive coupling between the sensor electrodes 207 and the conductive support substrate 208 based on the resulting signals. The determination module 1060 can control a user interface indicator in response to a change in capacitive coupling. The user interface indicator can comprise, for example, a cursor of an electronic device. The determination module 1060 can control motion of the cursor in response to changes in capacitive coupling between the sensor electrodes 207 and the conductive support substrate 208.

Figure 11:
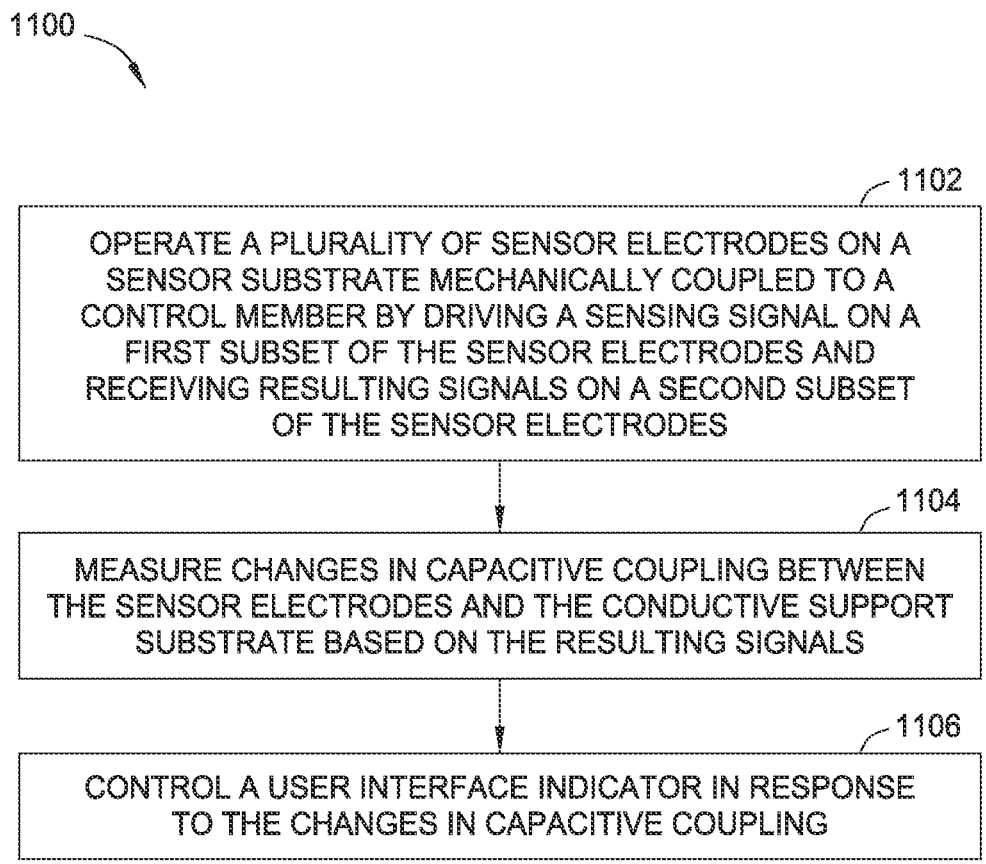
FIG. 11 is a flow diagram depicting a method of operating an input device configured to control a user interface indicator of an electronic device according to an embodiment.

FIG. 11 is a flow diagram depicting a method 1100 of operating an input device configured to control a user interface indicator of an electronic device according to an embodiment. The method 1100 begins at step 1102, where the processing system 110 operates a plurality of sensor electrodes 207 on a sensor substrate 206 mechanically coupled to a control member 202 by driving a sensing signal on a first subset of the sensor electrodes 207 and receiving resulting signals on a second subset of the sensor electrodes 207. At step 1104, the processing system 110 measures changes in capacitive coupling between the sensor electrodes 207 and a conductive support substrate 208 based on the resulting signals. At step 1106, the processing system 110 can control a user interface indicator in response to changes in the capacitive coupling.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. An isometric input device configured to control a user interface indicator of an electronic device, the input device comprising:
    a plurality of sensor electrodes disposed on a sensor substrate;
    a control member mechanically coupled to the sensor substrate over at least a portion of the plurality of sensor electrodes;
    a conductive support substrate; and
    a compliant member disposed between the sensor substrate and the conductive support substrate, the compliant member defining a gap between the sensor substrate and the conductive support substrate.

2. The input device of claim 1, wherein the sensor substrate is communicatively coupled to a processing system, the processing system configured to operate the plurality of sensor electrodes.

3. The input device of claim 2, wherein the processing system is configured to operate a capacitive touchpad of the electronic device.

4. The input device of claim 1, wherein the conductive support substrate is ohmically coupled to a substantially constant electrical potential.

5. The input device of claim 1, wherein a force applied to the control member results in a change in the gap between the sensor substrate and the conductive support substrate, changing a variable capacitance between at least one sensor electrode of the plurality of sensor electrodes and the conductive support substrate.

6. The input device of claim 1, wherein the plurality of sensor electrodes is configured for capacitively coupling with the conductive support substrate.

7. The input device of claim 1, wherein the control member includes a post extending through the sensor substrate, through an aperture of the compliant member, and through the conductive support substrate, and wherein the post is mechanically coupled to the conductive support substrate.

8. The input device of claim 7, wherein the post is heat staked to the conductive support substrate.

9. The input device of claim 1, wherein the control member comprises a plurality of alignment features, wherein the conductive support substrate comprises a plurality of alignment receiving features, and wherein the plurality of alignment features engage the plurality of alignment receiving features to restrict planar translation and rotation of the control member with respect to the conductive support substrate.

10. The input device of claim 1, wherein the compliant member is configured to provide a biasing force in response to a force applied to the button and a restoring force in response to movement of the control member.

11. The input device of claim 1, wherein the compliant member has a symmetrical shape comprising a first end contacting the control member, a second end contacting the conductive support substrate, and an aperture extending between the first end and the second end.

12. The input device of claim 1, wherein the compliant member comprises elastomeric material.

13. The input device of claim 1, wherein a surface of the control member opposite the sensor substrate includes an adapter, and wherein the input device comprises a cap mounted to the adapter of the control member.

14. A processing system for an input device configured to control a user interface indicator of an electronic device, the processing system comprising:
    a sensor module including sensor circuitry, the sensor module configured to operate a plurality of sensor electrodes on a sensor substrate mechanically coupled to a control member by driving a sensing signal on a first subset of the plurality of electrodes and receiving resulting signals from a second subset of the plurality of electrodes, the resulting signals including effects from a change in spacing between the sensor substrate and a conductive support substrate caused by a deflection of the control member; and
    a determination module configured to measure a change in capacitive coupling between the plurality of sensor electrodes and the conductive support substrate based on the resulting signals.

15. The processing system of claim 14, wherein the determination module is configured to control the user interface indicator in response to the change in capacitive coupling.

16. The processing system of claim 14, wherein the user interface indicator comprises a cursor and wherein the determination module is configured to control motion of the cursor in response to the change in capacitive coupling.

17. The processing system of claim 14, wherein the sensor module is configured to operate a capacitive touchpad of the electronic system.

18. The processing system of claim 14, wherein the conductive support substrate is configured to be coupled to a substantially constant electrical potential.

19. A method of operating an input device configured to control a user interface indicator of an electronic device, the method comprising:
   operating a plurality of sensor electrodes on a sensor substrate mechanically coupled to a control member by driving a sensing signal on a first subset of the plurality of electrodes and receiving resulting signals from a second subset of the plurality of electrodes, the resulting signals including effects from a change in spacing between the sensor substrate and a conductive support substrate caused by a deflection of the control member; and
   measuring a change in capacitive coupling between the plurality of sensor electrodes and the conductive support substrate based on the resulting signals.

20. The method of claim 19, further comprising:
   controlling the user interface indicator in response to the change in capacitive coupling.

* * * * *